United States Patent
Pendharkar et al.

(10) Patent No.: US 9,196,692 B2
(45) Date of Patent: Nov. 24, 2015

(54) METHOD TO FORM STEPPED DIELECTRIC FOR FIELD PLATE FORMATION

(71) Applicant: Texas Instruments Incorporated, Dallas, TX (US)

(72) Inventors: Sameer Pendharkar, Allen, TX (US); Naveen Tipirneni, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/706,595

(22) Filed: May 7, 2015

(65) Prior Publication Data

US 2015/0243742 A1 Aug. 27, 2015

Related U.S. Application Data

(62) Division of application No. 14/450,784, filed on Aug. 4, 2014, now Pat. No. 9,054,071, which is a division of application No. 13/886,709, filed on May 3, 2013, now Pat. No. 8,829,613.

(51) Int. Cl.
| | |
|---|---|
| *H01L 23/58* | (2006.01) |
| *H01L 29/40* | (2006.01) |
| *H01L 21/311* | (2006.01) |
| *H01L 29/417* | (2006.01) |
| *H01L 29/66* | (2006.01) |
| *H01L 29/812* | (2006.01) |
| *H01L 29/20* | (2006.01) |
| *H01L 29/78* | (2006.01) |

(52) U.S. Cl.
CPC ........ *H01L 29/404* (2013.01); *H01L 21/31144* (2013.01); *H01L 29/2003* (2013.01); *H01L 29/41766* (2013.01); *H01L 29/66871* (2013.01); *H01L 29/78* (2013.01); *H01L 29/812* (2013.01)

(58) Field of Classification Search
CPC ............ H01L 29/404; H01L 21/31144; H01L 29/41766; H01L 29/66871; H01L 29/812; H01L 29/2003; H01L 29/402; H01L 29/66431; H01L 29/66462; H01L 29/7786; H01L 29/7789
USPC .................. 257/335–337, 341–343, 488, 490
See application file for complete search history.

(56) References Cited

U.S. PATENT DOCUMENTS

| | | | |
|---|---|---|---|
| 2011/0204469 A1* | 8/2011 | Onishi | 257/490 |
| 2013/0341715 A1 | 12/2013 | McGregor | |
| 2014/0061659 A1 | 3/2014 | Teplik et al. | |
| 2014/0312417 A1* | 10/2014 | Strasser et al. | 257/339 |

* cited by examiner

*Primary Examiner* — Dung Le
(74) *Attorney, Agent, or Firm* — Jacqueline J. Garner; Frank D. Cimino

(57) ABSTRACT

A semiconductor device is formed with a stepped field plate over at least three sequential regions in which a total dielectric thickness under the stepped field plate is at least 10 percent thicker in each region compared to the preceding region. The total dielectric thickness in each region is uniform. The stepped field plate is formed over at least two dielectric layers, of which at least all but one dielectric layer is patterned so that at least a portion of a patterned dielectric layer is removed in one or more regions of the stepped field plate.

16 Claims, 5 Drawing Sheets

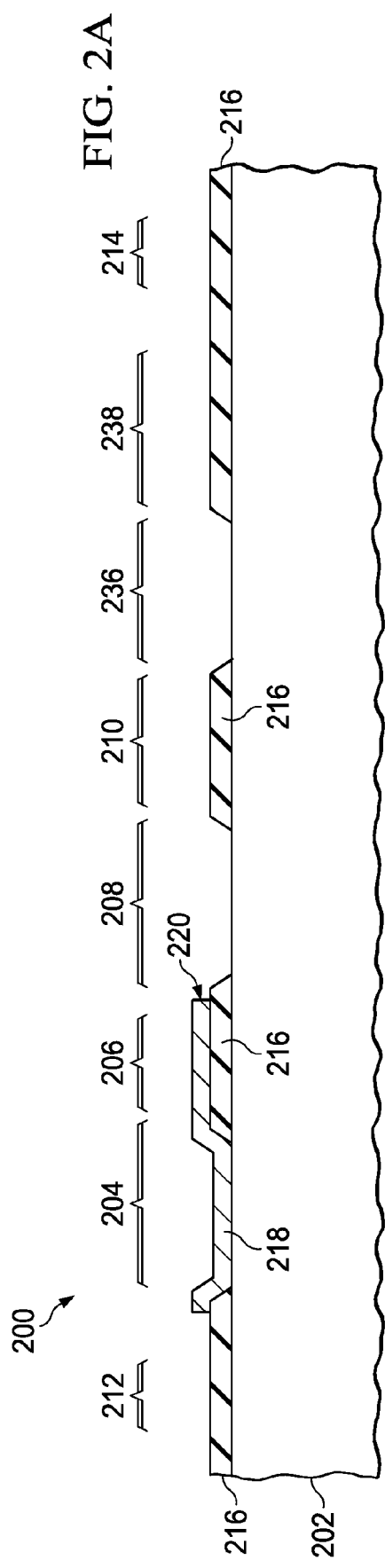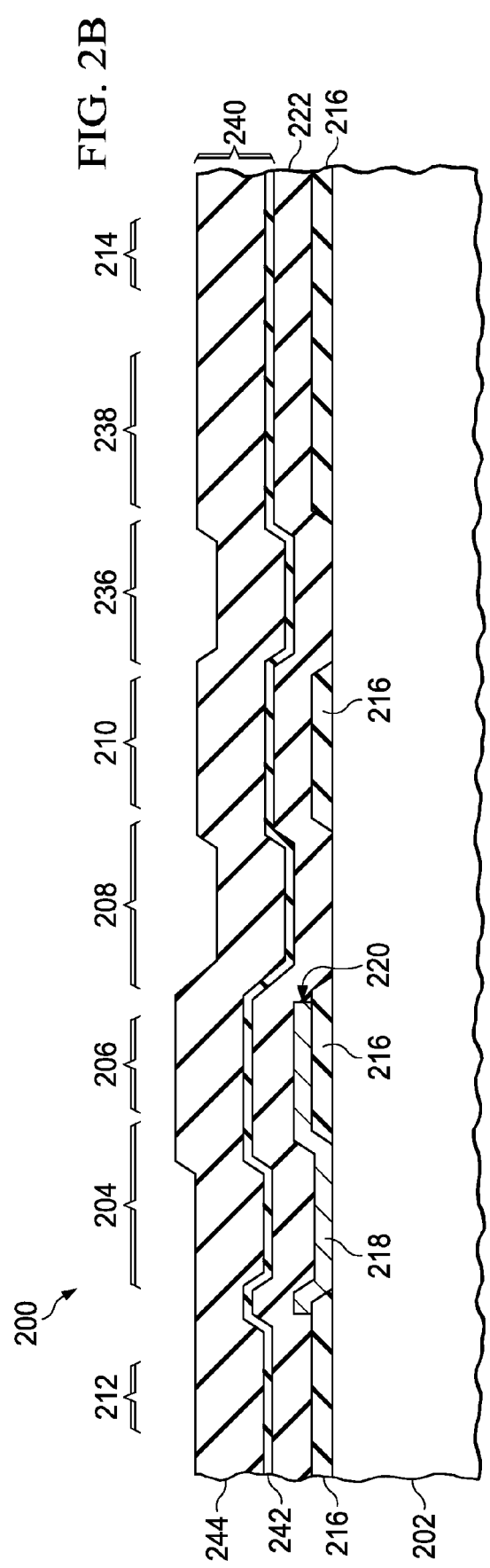

US 9,196,692 B2

METHOD TO FORM STEPPED DIELECTRIC FOR FIELD PLATE FORMATION

CROSS REFERENCE TO RELATED APPLICATIONS

This application is a divisional of U.S. Nonprovisional patent application Ser. No. 14/450,784, filed Aug. 4, 2014, which is a divisional of U.S. Nonprovisional patent application Ser. No. 13/886,709, filed May 3, 2013 (now U.S. Pat. No. 8,829,613), the contents of which are herein incorporated by reference in its entirety.

FIELD OF THE INVENTION

This invention relates to the field of semiconductor devices. More particularly, this invention relates to field plates in semiconductor devices.

BACKGROUND OF THE INVENTION

A semiconductor device such as a gallium nitride field effect transistor (GaN FET) may benefit by having a graduated field plate such that a dielectric thickness under the field plate varies monotonically over a region of the semiconductor substrate of the semiconductor device. The graduated field plate may maintain an electric field in the semiconductor substrate below a targeted value. Forming the graduated field plate while attaining a desired fabrication simplicity and fabrication cost may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device may be formed to have a stepped field plate, which is a form of graduated field plate. The stepped field plate includes at least three sequential regions in which a total dielectric thickness under the stepped field plate is at least 10 percent thicker in each region compared to the preceding region. The total dielectric thickness in each region is uniform. The stepped field plate is formed over at least two dielectric layers, of which at least all but one dielectric layer is patterned so that at least a portion of a patterned dielectric layer is removed in one or more regions of the stepped field plate.

DESCRIPTION OF THE VIEWS OF THE DRAWING

FIG. 2A through FIG. 2D are cross sections of another semiconductor device including a stepped field plate, depicted in successive stages of fabrication.

DETAILED DESCRIPTION OF EXAMPLE EMBODIMENTS

Figure 1A:
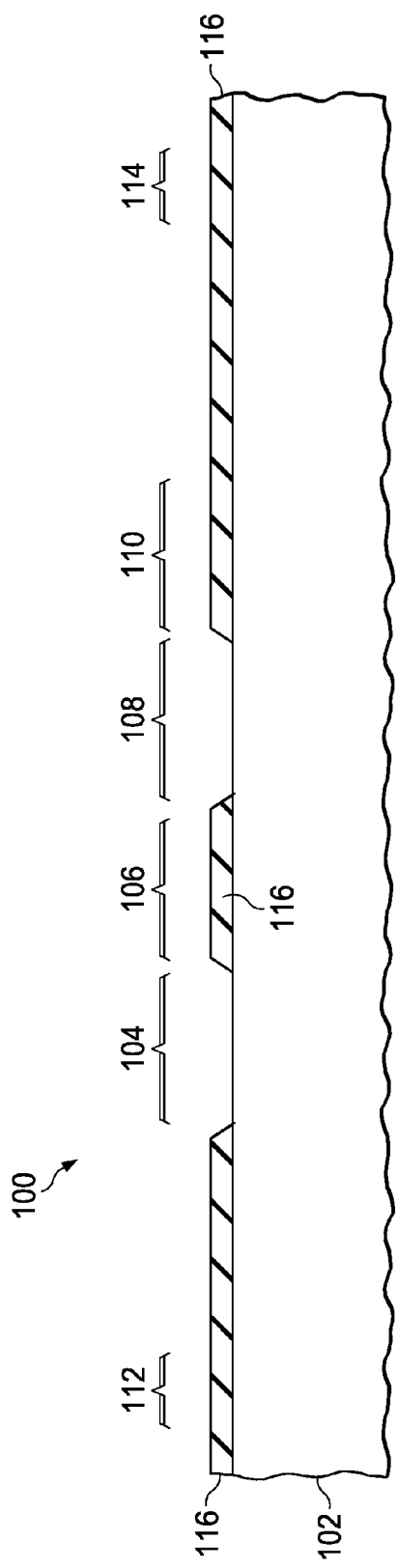
FIG. 1A through FIG. 1D are cross sections of a semiconductor device including a stepped field plate, depicted in successive stages of fabrication.

The following co-pending patent applications are related and hereby incorporated by reference:

U.S. patent application Ser. No. 13/886,378 (TI-71206 filed simultaneously with this application, entitled "AVALANCHE ENERGY HANDLING CAPABLE III-NITRIDE TRANSISTORS;"

U.S. patent application Ser. No. 13/886,410 (TI-71208 filed simultaneously with this application, entitled "III-NITRIDE ENHANCEMENT MODE TRANSISTORS WITH TUNABLE AND HIGH GATE-SOURCE VOLTAGE RATING;"

U.S. patent application Ser. No. 13/886,429 (TI-71209 filed simultaneously with this application, entitled "III-NITRIDE TRANSISTOR LAYOUT;"

U.S. patent application Ser. No. 13/886,652 (TI-71492 filed simultaneously with this application, entitled "LAYER TRANSFER OF SI100 ON TO III-NITRIDE MATERIAL FOR HETEROGENOUS INTEGRATION;"

U.S. patent application Ser. No. 13/886,688 (TI-72417 filed simultaneously with this application, entitled "RESURF III-NITRIDE HEMTS;"

U.S. patent application Ser. No. 13/886,744 (TI-72605 filed simultaneously with this application, entitled "GaN DIELECTRIC RELIABILITY ENHANCEMENT."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device may be formed to have a stepped field plate, which is a form of graduated field plate. The stepped field plate includes at least three sequential regions in which a total dielectric thickness under the stepped field plate is at least 10 percent thicker in each region compared to the preceding region. The total dielectric thickness in each region is uniform. The stepped field plate is formed over at least two dielectric layers, of which at least all but one dielectric layer is patterned so that at least a portion of a patterned dielectric layer is removed in one or more regions of the stepped field plate.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental makeup of III-N semiconductor materials do not imply a particular stoichiometry of the elements.

FIG. 1A through FIG. 1D are cross sections of a semiconductor device including a stepped field plate, depicted in successive stages of fabrication. Referring to FIG. 1A, the semiconductor device 100 is formed on a semiconductor substrate 102. The semiconductor substrate 102 may include, for example, single crystal silicon, gallium nitride or other III-N semiconductor material, silicon carbide, or gallium arsenide. The semiconductor device 100 may be, for example, a metal semiconductor field effect transistor (MESFET), a metal insulator field effect transistor (MISFET), a metal oxide field effect transistor (MOSFET), or a gallium nitride field effect transistor (GaN FET).

A dielectric layer, for example a gate dielectric layer, may be formed at a top surface of the semiconductor substrate 102. The semiconductor device 100 includes a gate area 104, a first field plate area 106 proximate to the gate area 104, a second field plate area 108 adjacent to the first field plate area 106, and a third field plate area 110 adjacent to the second field plate area 108. The semiconductor device 100 further includes a source area 112 proximate to the gate area 104 opposite the first field plate area 106, and a drain area 114 proximate to the third field plate area 110 opposite from the source area 112.

A first dielectric layer 116 is formed over the semiconductor substrate 102 and patterned so that at least a portion of the first dielectric layer 116 is removed in the gate area 104 and the second field plate area 108. A thickness of the first dielectric layer 116 within the first field plate area 106 is uniform; similarly, a thickness of the first dielectric layer 116 within the second field plate area 108 is uniform, and a thickness of the first dielectric layer 116 within the third field plate area 110 is uniform. The first dielectric layer 116 may include, for example, one or more layers of silicon dioxide, silicon nitride, silicon oxynitride, aluminum oxide, or other dielectric material. The first dielectric layer 116 may be formed, for example, using a chemical vapor deposition (CVD) process, plasma enhanced chemical vapor deposition (PECVD) process, low pressure chemical vapor deposition (LPCVD) process, atmospheric pressure chemical vapor deposition (APCVD) process, high density plasma (HDP) process, an ozone based thermal chemical vapor deposition (CVD) process, also known as the high aspect ratio process (HARP), or other suitable dielectric layer formation process. The first dielectric layer 116 may be, for example, 10 nanometers to 1000 nanometers thick.

Figure 1B:
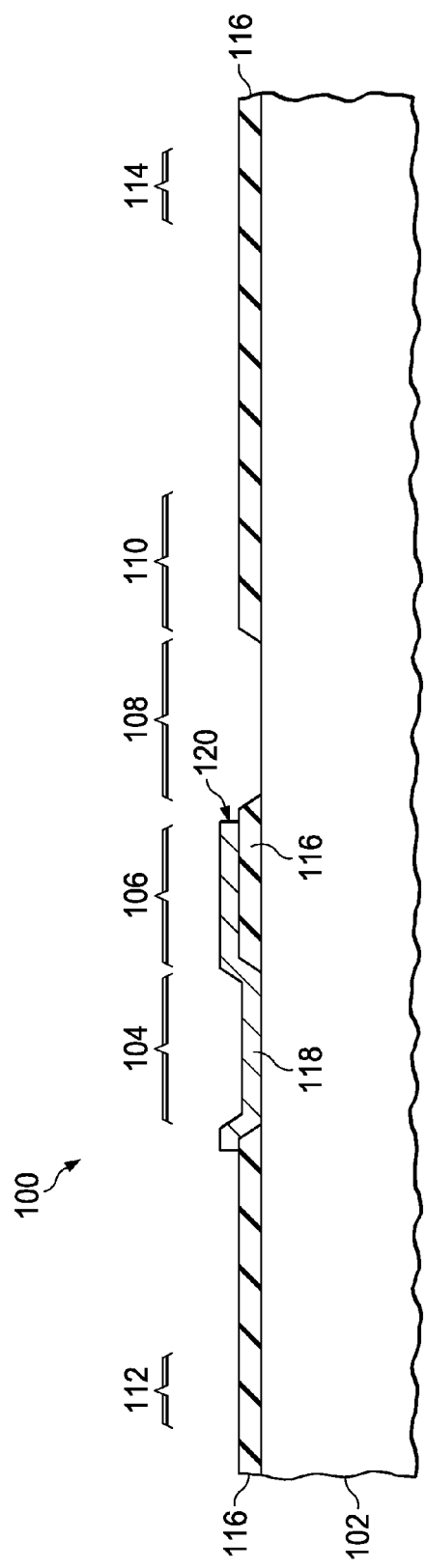

Referring to FIG. 1B, a gate 118 is formed over the semiconductor substrate 102 in the gate area 104. In the instant example, the gate 118 includes a gate field plate extension 120 which overlaps the first dielectric layer 116 across the first field plate area 106. The gate 118 may optionally overlap the first dielectric layer 116 on an opposite side from the first field plate area 106, as depicted in FIG. 1B. The gate 118 may include metal such as titanium nitride, titanium tungsten and/or semiconductor material such as polycrystalline silicon, aluminum gallium nitride or other III-N semiconductor material. The gate 118 may be a gate of a MESFET, a gate of a MISFET, a gate of a MOSFET, or a gate of a GaN FET.

Figure 1C:
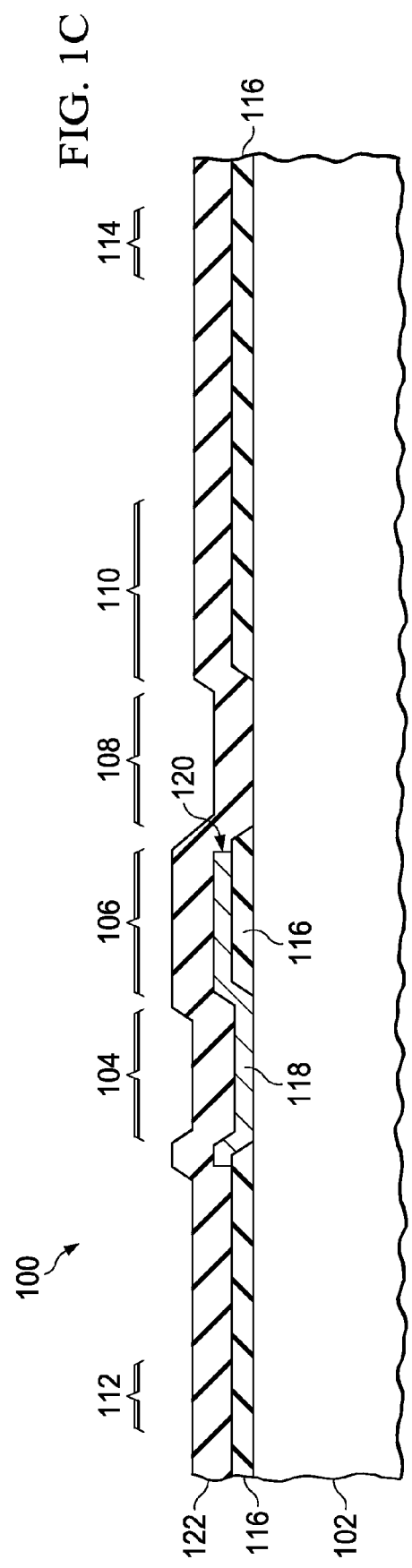

Referring to FIG. 1C, a second dielectric layer 122 is formed over the first dielectric layer 116, the gate 118 and the semiconductor substrate 102. The second dielectric layer 122 may be formed as described in reference to the first dielectric layer 116. A thickness of the second dielectric layer 122 in the second field plate area 108 is uniform and is at least 10 percent more than a thickness of the first dielectric layer 116 in the first field plate area 106. In the third field plate area 110, both the first dielectric layer 116 and the second dielectric layer 122 are present, so that a total thickness of the first dielectric layer 116 and the second dielectric layer 122 in the third field plate area 110 is uniform. The total thickness of the first dielectric layer 116 and the second dielectric layer 122 in the third field plate area 110 is at least 10 percent more than the thickness of the second dielectric layer 122 in the second field plate area 108.

Figure 1D:
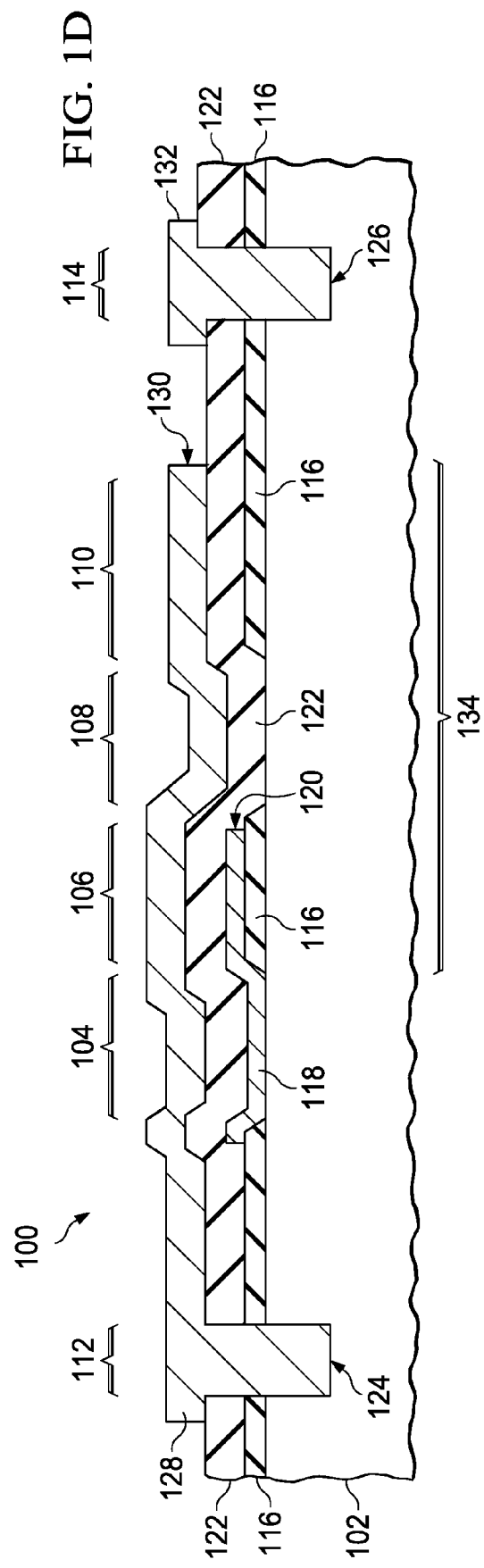

Referring to FIG. 1D, a source contact trench 124 is formed in the semiconductor substrate 102 proximate to the gate 118 opposite from the first field plate area 106. Concurrently, a drain contact trench 126 is formed in the semiconductor substrate 102 proximate to the third field plate area 110 opposite from the source contact trench 124. Contact metal is formed in the source contact trench 124 and the drain contact trench 126, overlapping the second dielectric layer 122. The contact metal is patterned to form a source contact 128 and a drain contact 132. The source contact 128 includes a source contact field plate extension 130 which overlaps the second field plate area 108 and the third field plate area 110.

The gate field plate extension 120 and the source contact field plate extension 130 combine to provide a stepped field plate 134 in the first field plate area 106 through the third field plate area 110. A capacitance per unit area in the first field plate area 106 between the gate field plate extension 120 and the semiconductor substrate 102 is at least 10 percent more than a capacitance per unit area in the second field plate area 108 between the source contact field plate extension 130 and the semiconductor substrate 102. A capacitance per unit area in the second field plate area 108 between the source contact field plate extension 130 and the semiconductor substrate 102 is at least 10 percent more than a capacitance per unit area in the third field plate area 110 between the source contact field plate extension 130 and the semiconductor substrate 102. The stepped field plate configuration of FIG. 1D required one dielectric patterning operation to obtain three sequential field plate areas. Forming the first dielectric layer 116, the second dielectric layer 122, the gate 118 and the source contact 128 in the first field plate area 106, the second field plate area 108 and the third field plate area 110 to have the configuration described in reference to FIG. 1D may simultaneously provide a desired reduction in electric field in the semiconductor substrate 102 and a desired fabrication cost for the semiconductor device 100.

Figure 2C:
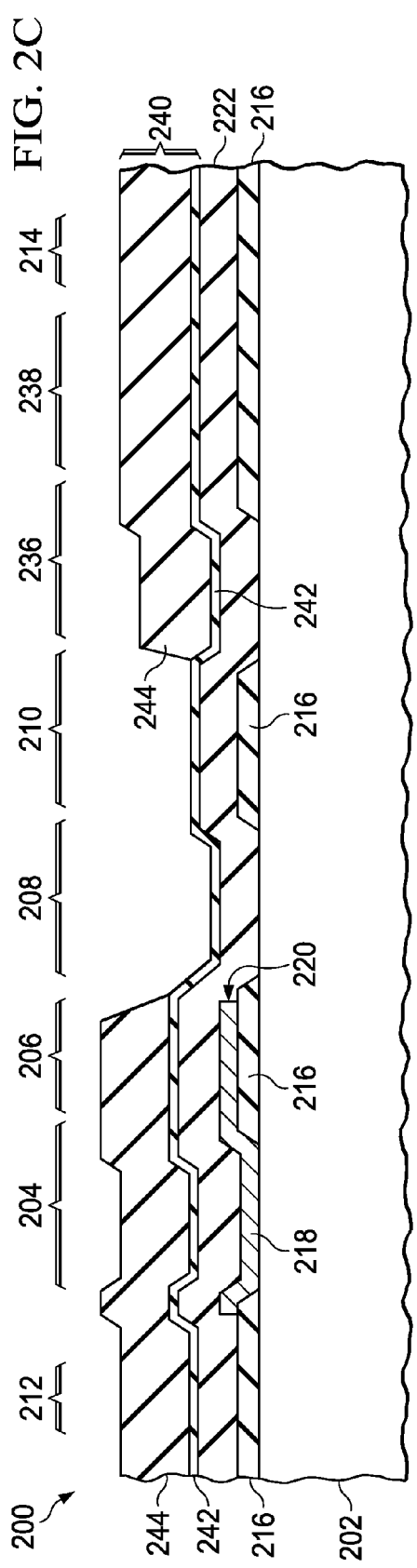

FIG. 2A through FIG. 2D are cross sections of another semiconductor device including a stepped field plate, depicted in successive stages of fabrication. Referring to FIG. 2A, the semiconductor device 200 is formed on a semiconductor substrate 202. A dielectric layer, for example a gate dielectric layer, may be formed at a top surface of the semiconductor substrate 202. The semiconductor device 200 includes a gate area 204, a first field plate area 206 proximate to the gate area 204, a second field plate area 208 adjacent to the first field plate area 206, a third field plate area 210 adjacent to the second field plate area 208, a fourth field plate area 236 adjacent to the third field plate area 210, and a fifth field plate area 238 adjacent to the fourth field plate area 236. The semiconductor device 200 further includes a source area 212 proximate to the gate area 204 opposite the first field plate area 206, and a drain area 214 proximate to the fifth field plate area 238 opposite from the source area 212.

A first dielectric layer 216 is formed over the semiconductor substrate 202 and patterned so that at least a portion of the first dielectric layer 216 is removed in the gate area 204, in the second field plate area 208 and the fourth field plate area 236. The first dielectric layer 216 may be formed as described in reference to FIG. 1A. A thickness of the first dielectric layer 216 in the first field plate area 206, in the third field plate area 210 and in the fifth field plate area 238 is uniform. A gate 218 is formed over the semiconductor substrate 202 in the gate area 204 with a gate field plate extension 220 overlapping the first dielectric layer in the first field plate area 206. The gate 218 may be formed as described in reference to FIG. 1B.

Referring to FIG. 2B, a second dielectric layer 222 is formed over the first dielectric layer 216, the gate 218 and the semiconductor substrate 202. A third dielectric layer 240 is formed over the second dielectric layer 222. In the instant example, the third dielectric layer 240 includes an etch stop sublayer 242 and a main dielectric sublayer 244. The etch stop sublayer 242 may include a dielectric material with an etch selectivity to dielectric material in the main dielectric sublayer 244. A thickness of the etch stop sublayer 242 may be 5 percent to 15 percent of a thickness of the main dielectric sublayer 244. For example, the etch stop sublayer 242 may be primarily composed of silicon nitride and the main dielectric sublayer 244 may be primarily composed of silicon dioxide.

A thickness of the second dielectric layer 222 in the first field plate area 206, in the second field plate area 208, in the third field plate area 210, in the fourth field plate area 236 and in the fifth field plate area 238 is uniform. A thickness of the third dielectric layer 240 in the fourth field plate area 236 and in the fifth field plate area 238 is uniform.

Referring to FIG. 2C, the third dielectric layer 240 is patterned so as to remove the main dielectric sublayer 244 in at least the second field plate area 208 and the third field plate area 210. in the instant example, at least a portion of the etch stop sublayer 242 remains in the second field plate area 208 and the third field plate area 210 after the third dielectric layer 240 has been patterned. The third dielectric layer 240 may be patterned using a plasma etch or a wet etch.

Figure 2D:
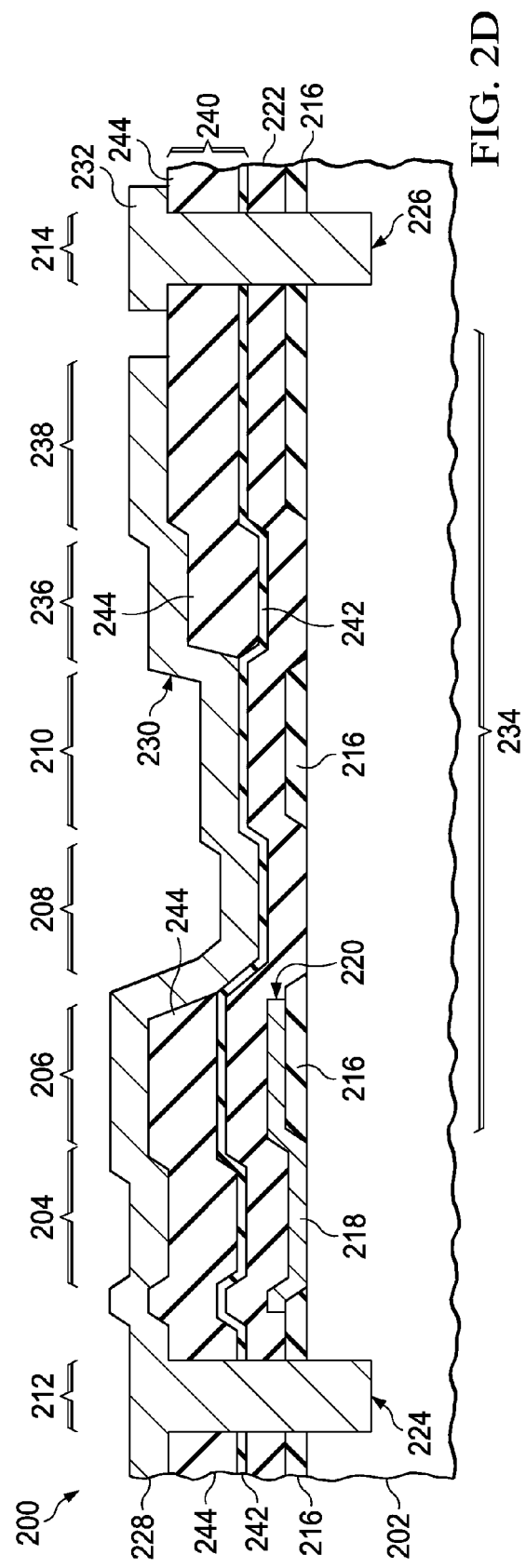

Referring to FIG. 2D, a source contact trench 224 is formed in the semiconductor substrate 202 proximate to the gate 218 opposite from the first field plate area 206. Concurrently, a drain contact trench 226 is formed in the semiconductor substrate 202 proximate to the fifth field plate area 238 opposite from the source contact trench 224. Contact metal is formed in the source contact trench 224 and the drain contact trench 226, overlapping the second field plate area 208 through the fifth field plate area 238. The contact metal is patterned to form a source contact 228 and a drain contact 232. The source contact 228 includes a source contact field plate extension 230 which overlaps the second field plate area 208 through the fifth field plate area 238.

The gate field plate extension 220 and the source contact field plate extension 230 combine to provide a stepped field plate 234 in the first field plate area 106 through the third field plate area 110. A capacitance per unit area in the first field plate area 206 between the gate field plate extension 220 and the semiconductor substrate 202 is at least 10 percent more than a capacitance per unit area in the second field plate area 208 between the source contact field plate extension 230 and the semiconductor substrate 202. A capacitance per unit area in the second field plate area 208 between the source contact field plate extension 230 and the semiconductor substrate 202 is at least 10 percent more than a capacitance per unit area in the third field plate area 210 between the source contact field plate extension 230 and the semiconductor substrate 202, which is in turn at least 10 percent more than a capacitance per unit area in the fourth field plate area 236 between the source contact field plate extension 230 and the semiconductor substrate 202, which is in turn at least 10 percent more than a capacitance per unit area in the fifth field plate area 238 between the source contact field plate extension 230 and the semiconductor substrate 202. The field plate configuration of FIG. 1D required two dielectric patterning operations to obtain five sequential field plate areas. Forming the first dielectric layer 216, the second dielectric layer 222, the third dielectric layer 240, the gate 218 and the source contact 228 in the first field plate area 106 through the fifth field plate area 238 to have the configuration described in reference to FIG. 2D may simultaneously provide a desired reduction in electric field in the semiconductor substrate 202 and a desired fabrication cost for the semiconductor device 200.

Figure 3:
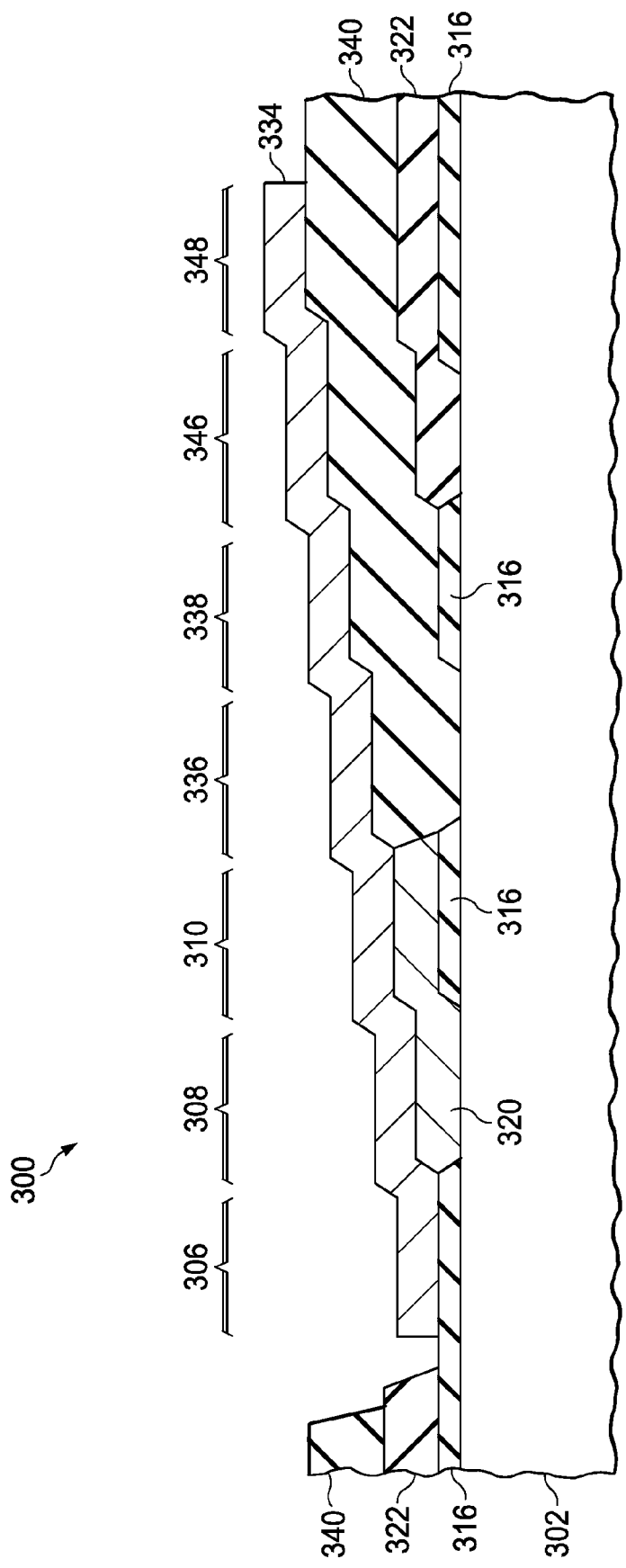
FIG. 3 is a cross section of a further semiconductor device having a stepped field plate.

FIG. 3 is a cross section of a further semiconductor device having a stepped field plate. The semiconductor device 300 is formed on a semiconductor substrate 302. The semiconductor device 300 includes a first field plate area 306, a second field plate area 308 adjacent to the first field plate area 306, a third field plate area 310 adjacent to the second field plate area 308, a fourth field plate area 336 adjacent to the third field plate area 310, a fifth field plate area 338 adjacent to the fourth field plate area 336, a sixth field plate area 346 adjacent to the fifth field plate area 338, and a seventh field plate area 348 adjacent to the sixth field plate area 346.

A first dielectric layer 316 is formed over the semiconductor substrate 302 and patterned so that at least a portion of the first dielectric layer 316 is removed in the second field plate area 208, in the fourth field plate area 236 and in the sixth field plate area 346. The first dielectric layer 316 may be formed as described in reference to FIG. 1A. A thickness of the first dielectric layer 316 in the first field plate area 306, in the third field plate area 310, in the fifth field plate area 338 and in the seventh field plate area 348 is uniform.

A second dielectric layer 322 is formed over the first dielectric layer 316 and over the semiconductor substrate 302, and patterned so that at least a portion of the second dielectric layer 322 is removed in the first field plate area 306, in the fourth field plate area 336 and in the fifth field plate area 338. The second dielectric layer 322 may be formed as described in reference to FIG. 1C. A thickness of the second dielectric layer 322 in the second field plate area 208, in the third field plate area 310, in the sixth field plate area 346 and in the seventh field plate area 348 is uniform.

A third dielectric layer 340 is formed over the second dielectric layer 322, over the first dielectric layer 316 and over the semiconductor substrate 302, and patterned so that at least a portion of the third dielectric layer 340 is removed in the first field plate area 306, in the second field plate area 308 and in the third field plate area 310. The third dielectric layer 340 may be formed as described in reference to FIG. 2D. A thickness of the third dielectric layer 340 in the fourth field plate area 336, in the fifth field plate area 338, in the sixth field plate area 346 and in the seventh field plate area 348 is uniform.

A stepped field plate 334 is formed over the first dielectric layer 316, the second dielectric layer 322 and the third dielectric layer 340 in the first field plate area 306 through the seventh field plate area 348. The stepped field plate 334 may include metal, polycrystalline silicon, metal silicide or other electrically conductive material. A capacitance per unit area between the stepped field plate 334 and the semiconductor substrate 302 increases by at least 10 percent in the seventh field plate area 348 through the first field plate area 306. The field plate configuration of FIG. 3 required three dielectric patterning operations to obtain seven sequential field plate areas. Forming the first dielectric layer 316, the second dielectric layer 322, the third dielectric layer 340 and the stepped field plate 334 in the first field plate area 306 through the seventh field plate area 348 to have the configuration described in reference to FIG. 3 may simultaneously provide a desired reduction in electric field in the semiconductor substrate 302 and a desired fabrication cost for the semiconductor device 300.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a semiconductor substrate;
   a first field plate area defined over said substrate, a second field plate area defined over said substrate adjacent to said first field plate area, and a third field plate area defined over said semiconductor substrate adjacent to said second field plate area;
   a first dielectric layer disposed over said semiconductor substrate, of which at least a portion of said first dielectric layer is absent in at least one of said first field plate area, said second field plate area and said third field plate area;
   a second dielectric layer disposed over said first dielectric layer and over said semiconductor substrate; and
   a stepped field plate disposed over said first dielectric layer and said second dielectric layer in said first field plate area, said second field plate area and said third field plate area, in which:
      a total dielectric thickness in said second field plate area between said stepped field plate and said semiconductor substrate is at least 10 percent more than a total dielectric thickness in said first field plate area between said stepped field plate and said semiconductor substrate; and
      a total dielectric thickness in said third field plate area between said stepped field plate and said semiconductor substrate is at least 10 percent more than a total dielectric thickness in said second field plate area between said stepped field plate and said semiconductor substrate.

2. The semiconductor device of claim 1, wherein said first dielectric layer includes silicon nitride.

3. The semiconductor device of claim 1, wherein said stepped field plate includes a gate field plate extension of a gate of a transistor.

4. The semiconductor device of claim 1, wherein said stepped field plate includes a source contact field plate extension of a source contact of a transistor.

5. The semiconductor device of claim 1, further including:
   a fourth field plate area defined over said substrate adjacent to said third field plate area, and a fifth field plate area defined over said substrate adjacent to said fourth field plate area;
   a third dielectric layer disposed over said second dielectric layer, said first dielectric layer and said semiconductor substrate, and under said stepped field plate, of which at least a portion of said third dielectric layer is absent in at least one of said first field plate area, said second field plate area, said third field plate area and said fourth field plate area.

6. The semiconductor device of claim 5, wherein said third dielectric layer includes more than one dielectric sublayer.

7. The semiconductor device of claim 5, wherein said third dielectric layer includes an etch stop sublayer and a main dielectric sublayer over said etch stop sublayer, and said absent portion of said third dielectric layer does not include said etch stop sublayer.

8. The semiconductor device of claim 5, wherein at least a portion of at least one of said first dielectric layer, said second dielectric layer and said third dielectric layer is absent in said fourth field plate area.

9. The semiconductor device of claim 1, wherein said semiconductor device is a gallium nitride field effect transistor (GaN FET).

10. A semiconductor device, comprising:
    a semiconductor substrate;
    a first dielectric layer over the semiconductor substrate;
    a second dielectric layer over the semiconductor substrate and the first dielectric layer;
    a third dielectric layer over the semiconductor substrate;
    a stepped field plate disposed over the semiconductor substrate, the stepped field plate having a first portion separated from the semiconductor substrate by the second dielectric layer but not the first dielectric layer or the third dielectric layer, a second portion adjacent the first portion and separated from the semiconductor substrate by the first dielectric layer and the second dielectric layer but not the third dielectric layer, and a third portion separated from the semiconductor substrate by the second dielectric layer and the third dielectric layer but not the first dielectric layer, in which:
       a total dielectric thickness between the second portion of said stepped field plate and said semiconductor substrate is at least 10 percent more than a total dielectric thickness between the first portion of said stepped field plate and said semiconductor substrate; and
       a total dielectric thickness between the third portion of said stepped field plate and said semiconductor substrate is at least 10 percent more than a total dielectric thickness between the second portion of said stepped field plate and said semiconductor substrate.

11. The semiconductor device of claim 10, wherein said first dielectric layer includes silicon nitride.

12. The semiconductor device of claim 10, wherein said stepped field plate includes a gate field plate extension of a gate of a transistor.

13. The semiconductor device of claim 10, wherein said stepped field plate includes a source contact field plate extension of a source contact of a transistor.

14. The semiconductor device of claim 10, further including:
    a fourth portion of said stepped field plate adjacent to said third portion, the fourth portion separated from the semiconductor substrate by the first dielectric layer, the second dielectric layer, and the third dielectric layer.

15. The semiconductor device of claim 14, further comprising an etch stop sublayer under the third dielectric layer.

16. The semiconductor device of claim 10, wherein said semiconductor device is a gallium nitride field effect transistor (GaN FET).

* * * * *